United States Patent
Bakalski et al.

(10) Patent No.: US 8,513,782 B2
(45) Date of Patent: Aug. 20, 2013

(54) SHIELDING DEVICE

(75) Inventors: Winfried Bakalski, Munich (DE); Bernd Eisener, Hohenbrunn (DE); Uwe Seidel, Munich (DE); Markus Zannoth, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 12 days.

(21) Appl. No.: 13/178,107

(22) Filed: Jul. 7, 2011

(65) Prior Publication Data

US 2011/0260302 A1     Oct. 27, 2011

Related U.S. Application Data

(62) Division of application No. 11/742,198, filed on Apr. 30, 2007, now Pat. No. 7,999,358.

(30) Foreign Application Priority Data

May 12, 2006 (DE) .......................... 10 2006 022 360

(51) Int. Cl.
    *H01L 23/552*     (2006.01)

(52) U.S. Cl.
    USPC ............... 257/659; 257/508; 257/E23.114

(58) Field of Classification Search
    USPC ................ 257/347, 409, 508–510, 659–660, 257/E23.114
    See application file for complete search history.

(56) References Cited

U.S. PATENT DOCUMENTS

| | | | |
|---|---|---|---|
| 5,151,770 A * | 9/1992 | Inoue | 257/660 |
| 5,196,920 A | 3/1993 | Kumamoto et al. | |
| 5,742,082 A | 4/1998 | Tehrani et al. | |
| 5,973,374 A | 10/1999 | Longcor | |
| 6,125,042 A | 9/2000 | Verdi et al. | |
| 6,420,741 B1 * | 7/2002 | Nakajima | 257/295 |
| 6,472,723 B1 | 10/2002 | Jarstad et al. | |
| 6,646,328 B2 | 11/2003 | Tsai | |
| 6,982,477 B2 | 1/2006 | Adan | |
| 7,030,455 B2 | 4/2006 | Gamand et al. | |
| 2002/0109204 A1 | 8/2002 | Acosta et al. | |
| 2002/0195719 A1 | 12/2002 | Shah et al. | |
| 2003/0017646 A1 | 1/2003 | Sridharan et al. | |

(Continued)

FOREIGN PATENT DOCUMENTS

| | | |
|---|---|---|
| DE | 10337256 | 6/2004 |
| DE | 10309614 | 9/2004 |
| EP | 0872888 | 10/1998 |

OTHER PUBLICATIONS

Non-Final Office Action relative to U.S. Appl. No. 11/742,198 mailed Oct. 28, 2008.

(Continued)

*Primary Examiner* — Tucker Wright

(74) *Attorney, Agent, or Firm* — Dicke, Billig & Czaja, PLLC

(57) ABSTRACT

One aspect of the invention relates to a shielding device for shielding from electromagnetic radiation, including a shielding base element, a shielding cover element and a shielding lateral element for electrically connecting the base element to the cover element in such that a circuit part to be shielded is arranged within the shielding elements. Since at least one partial section of the shielding elements includes a semiconductor material, a shielding device can be realized completely and cost-effectively in an integrated circuit.

20 Claims, 7 Drawing Sheets

(56) References Cited

U.S. PATENT DOCUMENTS

| | | | |
|---|---|---|---|
| 2004/0222506 A1* | 11/2004 | Wei et al. | 257/686 |
| 2004/0222511 A1 | 11/2004 | Zhang | |
| 2005/0067722 A1 | 3/2005 | Koike | |
| 2006/0055028 A1* | 3/2006 | Hasunuma | 257/706 |

OTHER PUBLICATIONS

Final Office Action relative to U.S. Appl. No. 11/742,198 mailed Feb. 19, 2009.

Non-Final Office Action relative to U.S. Appl. No. 11/742,198 mailed Nov. 4, 2009.

Advisory Action relative to U.S. Appl. No. 11/742,198 mailed May 28, 2010.

James Plummer, et al., "Silicon VLSI Fundamentals, Practice and Modeling", 2000, Prentice Hall, pp. 17-18.

* cited by examiner

SHIELDING DEVICE

CROSS-REFERENCE TO RELATED APPLICATIONS

This Utility Patent Application is a divisional application of U.S. application Ser. No. 11/742,198, filed Apr. 30, 2007, which claims the benefit of the filing date of German Application No. DE 10 2006 022 360.8, filed May 12, 2006, which are herein incorporated by reference.

BACKGROUND

One aspect of the invention relates to a shielding device for shielding from electromagnetic radiation, and in particular to an integrated shielding device for shielding from electromagnetic radiation for circuit parts of an integrated semiconductor circuit which are to be shielded.

In the realization of highly complex circuits, particularly in integrated semiconductor circuits, an increasingly wide variety of circuit parts or circuit blocks have to be realized, which often influence one another in an undesirable manner. Logic circuit parts may be involved in this case, for example, which cause a crosstalk in the form of coupling of electromagnetic fields into analog circuit parts, for example.

Particularly in the case of radiofrequency transformer circuits, such crosstalk often becomes apparent through undesirable emissions in the form of spurii, that is, secondary lines in the spectrum, or undesirable oscillation. Besides the influence of digital circuit parts on analog circuit parts and the mutual decoupling of radiofrequency circuit parts, a better decoupling of power stages with respect to low-power circuit parts is often required as well.

Such decoupling or shielding of critical circuit parts from the rest of an integrated circuit is at odds, however, with the increasing integration density demanded particularly in the case of integrated semiconductor circuits.

In some integrated circuits (such as e.g. semiconductor circuits), therefore, there is the need to reliably shield specific circuit parts in such a way that either no electromagnetic radiation escapes from these circuit parts or these circuit parts, are not influenced by externally arriving electromagnetic radiation.

By using multichip modules (MCM), sensitive circuit parts have hitherto been transferred and protected against the influence of electromagnetic radiation by using corresponding shielding. In this case, multichip modules (MCM) are understood to be electronic assemblies which may contain a multiplicity of integrated circuit devices (IC chips) and/or a multiplicity of discrete components which are coupled to one another by using a connecting substrate. In this case, multichip modules of this type may include a plurality of semiconductor chips and other discrete components, which may in each case have a dedicated shielding device in the form of a Faraday cage.

Although the principles for such a multichip module design and also the associated production technologies are relatively well known, such conventional technologies have been unable hitherto to enable a production method with low costs and a high volume.

Furthermore, there is the possibility of obtaining a further improvement in the crosstalk behavior by using a corresponding "layout" or "floor planning", that is to say a positioning of the respective circuit parts in the layout of a semiconductor device and a differential circuit design. An increased space requirement, which is an obstacle to the future increased integration density with its accompanying miniaturization, is disadvantageous in this case, however. Since the attenuation of the electromagnetic fields increases with distance, severe limits are imposed on more extensive integration.

SUMMARY

One embodiment includes a shielding device for shielding from electromagnetic radiation. The shielding device includes a shielding base element, a shielding cover element and a shielding lateral element for electrically connecting the base element to the cover element in such that a circuit part to be shielded is arranged within the shielding elements. Since at least one partial section of the shielding elements includes a semiconductor material, for the first time a shielding device can be realized completely and cost-effectively in an integrated circuit.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
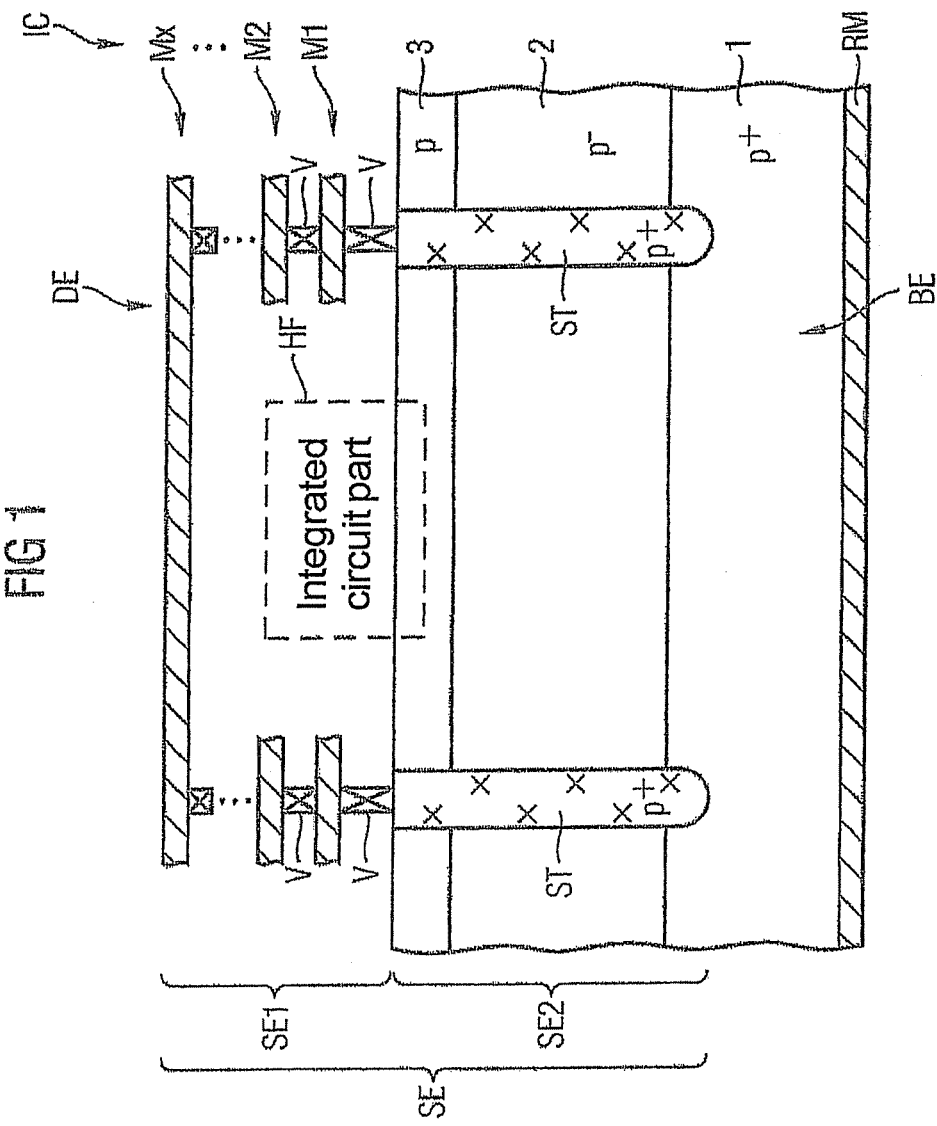
FIG. 1 illustrates a simplified sectional view of an integrated circuit with integrated shielding device for a circuit part to be shielded in accordance with a first exemplary embodiment.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment provides a shielding device for shielding from electromagnetic radiation which can be realized without a significant increase in the production costs and the space requirement.

One embodiment is achieved by using a shielding device for shielding from electromagnetic radiation, including: a shielding base element; a shielding cover element; and a shielding lateral element for electrically connecting the base element to the cover element in such a way that a circuit part to be shielded is arranged within the shielding elements, wherein at least one partial section of the shielding elements includes a semiconductor material.

In one case, a semiconductor material is used for at least one partial section of the shielding elements, such that a shielding device can be partly integrated directly into an integrated circuit.

In one case, the circuit part to be shielded is formed in a carrier substrate for an integrated circuit, the shielding base element including semiconductor material and in particular constituting a semiconductor substrate of the carrier substrate.

In one example, the resistivity value of the semiconductor material is below 15 mohm-cm, whereby an improved "ground" linking can be achieved and an increased shielding effect can thus be obtained.

In one example, a shielding cover element is formed in a metallization level of the integrated circuit, whereby an electromagnetic shielding can also be realized toward the top by using layer elements of the integrated circuit which are present anyway. The shielding lateral element is divided into an upper lateral element and a lower lateral element, the upper lateral element having a multiplicity of contact vias formed between the metallization levels, and the lower lateral element having at least one sinker contact trench or a multiplicity of sinker contact trench structures formed in the carrier substrate. In this case, the sinker contact trench may be filled with metallic material or highly conductive semiconductor material and constitute a closed ring, whereby an standing lateral shielding can in turn be realized by using processes which are usually present in a standard production method.

A multiplicity of sinker contact vias may be arranged either in one line or in a plurality of lines around the circuit part to be shielded, in which case, when a plurality of lines are used, said lines may furthermore be offset with respect to one another. With the respective sinker contact vias being correspondingly spaced apart from one another, an outstanding lateral shielding is once again obtained for the circuit part to be shielded.

The carrier substrate used may be an SOI substrate or a conventional semiconductor substrate which has a sufficiently high conductivity. In this case, the circuit part to be shielded may be situated in a weakly doped epitaxial semiconductor layer with high well doping, or in a semiconductor layer situated on the insulating layer of the SOI substrate.

Furthermore, the carrier substrate may have a rear side metallization at least in the region of the shielding base element, whereby a shielding effect of the semiconductor material can be improved.

FIG. 1 illustrates a simplified sectional view of an integrated circuit IC, in which is formed a shielding device according to the invention for shielding an integrated circuit part HF.

In accordance with FIG. 1, the carrier substrate used may be a heavily doped semiconductor substrate 1, at the surface of which is formed a weakly doped semiconductor layer 2, which is deposited epitaxially, for example. In order to realize an active area for the integrated circuit or the integrated circuit part HF to be shielded, at least one doping well 3 may furthermore be formed in said epitaxially deposited semiconductor layer. In said well 3 or at the surface of said semiconductor layer, it is subsequently possible to realize integrated semiconductor components in the customary manner, such as, for example, field effect transistors, bipolar transistors, MOS capacitances, MIM capacitances, resistors, coils, etc., in which case it is also possible to use overlying metallization or wiring layers MI, M2, etc.

By way of example, a silicon semiconductor substrate is used as the heavily doped semiconductor substrate 1, it also being possible to use any other semiconductor substrates, such as 111-V compound semiconductors, by way of example. In accordance with the first exemplary embodiment, the heavily doped semiconductor substrate 1 has a p+-type doping, but it is also possible, in principle, to use n-doped semiconductor substrates.

A dopant concentration is set in such a way that a resistivity value of the semiconductor material or of the semiconductor substrate 1 of less than 15 mohm-cm results. This corresponds approximately to a dopant concentration of $4*10E18$ atoms/cm3 by using e.g., boron as dopant. This results in the semiconductor substrate 1 having a sufficiently high conductivity for the shielding function.

The semiconductor layer 2 has for example a doping p-integral to the doping of the semiconductor substrate 1, a dopant concentration being greatly reduced by comparison with the semiconductor substrate and resulting for example in a resistivity value of approximately 10 ohm-cm. This corresponds approximately to a dopant concentration of $1.355*10E15$ atoms/cm3 by using e.g., boron. The well 3 formed at the surface of the semiconductor layer 2 may in turn have the same conduction type as the semiconductor substrate 1 and semiconductor layer 2, but a higher doping is used in order to realize lower resistivity values. In accordance with the first exemplary embodiment, the well 3 is e.g., a p-type well with a resistance value of approximately 50 mohm-cm.

In accordance with FIG. 1, the highly doped semiconductor substrate 1 with its low resistivity value of less than 15 mohm-cm (or a dopant concentration of greater than $4*10E18$ atoms/cm3) has a thickness of 165 micrometers, for example, whereby it makes up a significant portion of the carrier substrate. By contrast, the weakly doped semiconductor layer 2 may have a thickness of only approximately 5 micrometers, while the well 3 may have a depth of 1 to 3 micrometers, for example.

Furthermore, shallow trench isolations (STI) for isolating respective components may also be formed in the well 3 and the semiconductor layer 2.

A detailed description of the integrated circuit part to be shielded has been dispensed with below since this is not of importance to the present invention. By way of example, a radio frequency or intermediate 5 frequency circuit may be integrated as integrated circuit part HF. Frequencies of greater than approximately 800 MHz are usually used in radio frequency circuits, frequencies of between approximately 200 and 800 MHz being employed in intermediate frequency circuits. In the same way, however, the integrated circuit part HF may also constitute a digital logic circuit or an analog circuit, the intention being to prevent crosstalk in the form of coupling by electromagnet fields reliably and cost-effectively.

Figure 8:
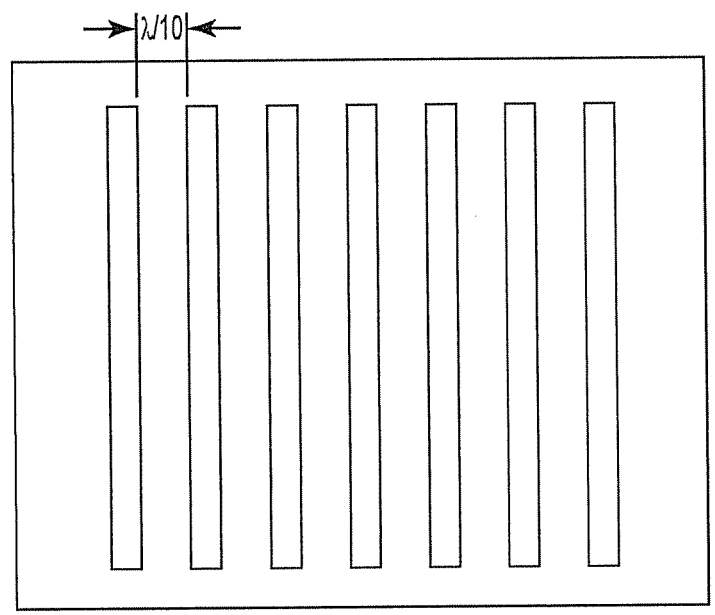
FIG. 8 illustrates a top view of a strip-type cover element in accordance with an exemplary embodiment.
Figure 9:
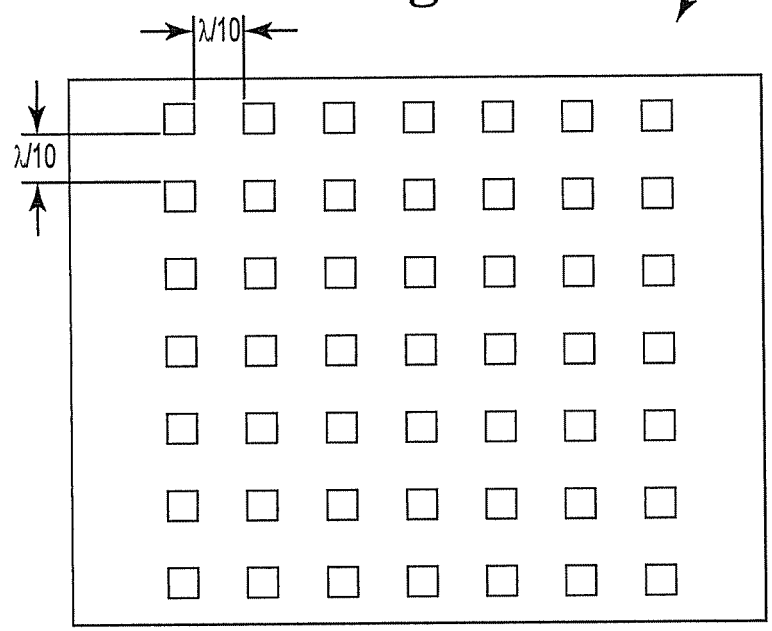
FIG. 9 illustrates a top view of a grid-type cover element in accordance with an exemplary embodiment.

For this purpose, the invention provides an integrated shielding device, e.g., in the form of a closed cage, for shielding from electromagnetic radiation, which can for the first time be realized completely in the integrated circuit IC. In this case, the shielding device may include a shielding base element BE, which includes a section of the high doped semiconductor substrate 1 in accordance with FIG. 1, a shielding cover element DE, which is realized by one or a plurality of wiring or metallization levels in the wiring of the integrated circuit IC, and a shielding lateral element SE, which electrically connects the base element to the cover element DE in such a way that the integrated circuit part HF to be shielded is arranged within the shielding elements and reliably prevents an entry or emergence of electromagnetic radiation to the Faraday cage thereby produced. Although the base and cover elements are formed over the whole area in the wiring level of the semiconductor substrate, they may, in principle, also be formed in strip-type, as illustrated in FIG. 8, or grid-type fashion, as illustrated in FIG. 9, where a spacing-apart is less than $\lambda/10$ and $\lambda$ represents the wavelength of the electromagnetic radiation to be shielded. A higher attenuation is produced in the case of even smaller distances or a closer-meshed grid.

In accordance with FIG. 1, the shielding lateral element SE may have an upper lateral element SE1, which is realized in the wiring levels, and also a lower lateral element SE2, which is realized in the carrier substrate 1, 2, 3 and extends at least from the surface of the carrier substrate or the well 3 as far as the highly conductive semiconductor 1.

In accordance with FIG. 1, the lower lateral element SE2 may have at least one sinker contact trench ST which is formed in the carrier substrate 1, 2, 3 and is electrically conductive. By way of example, a deep trench reaching as far as the highly doped semiconductor substrate 1 can be produced by using trench technologies present in the standard production process, said deep trench being filled with an electrically conductive filling material such as, for example, a metallic material or highly doped semiconductor material, e.g., polysilicon. It goes without saying that it is also possible to use a plurality of layers of (e.g., different) electrically conductive materials.

In accordance with the first exemplary embodiment, $p^+$-type polysilicon, for example, may be deposited in the deep trench in order to realize the sinker contact trench ST by using a CVD method directly at the trench walls. This results in an outstanding lateral shielding of the integrated circuit part HF by the highly conductive semiconductor material of the sinker contact trench ST.

In principle, other filling materials are also conceivable, in particular the trench walls of the sinker trench having an insulating layer apart from a contact region to the semiconductor substrate 1 and the electrically conductive filling layer such as, for example, a metallic monolayer or multilayer or an electrically conductive semiconductor layer being filled on said insulating layer. In this case, only the semiconductor substrate 1 is electrically contact-connected, while the semiconductor layer 2 and the well 3 are isolated by the insulating layer.

Figure 2:
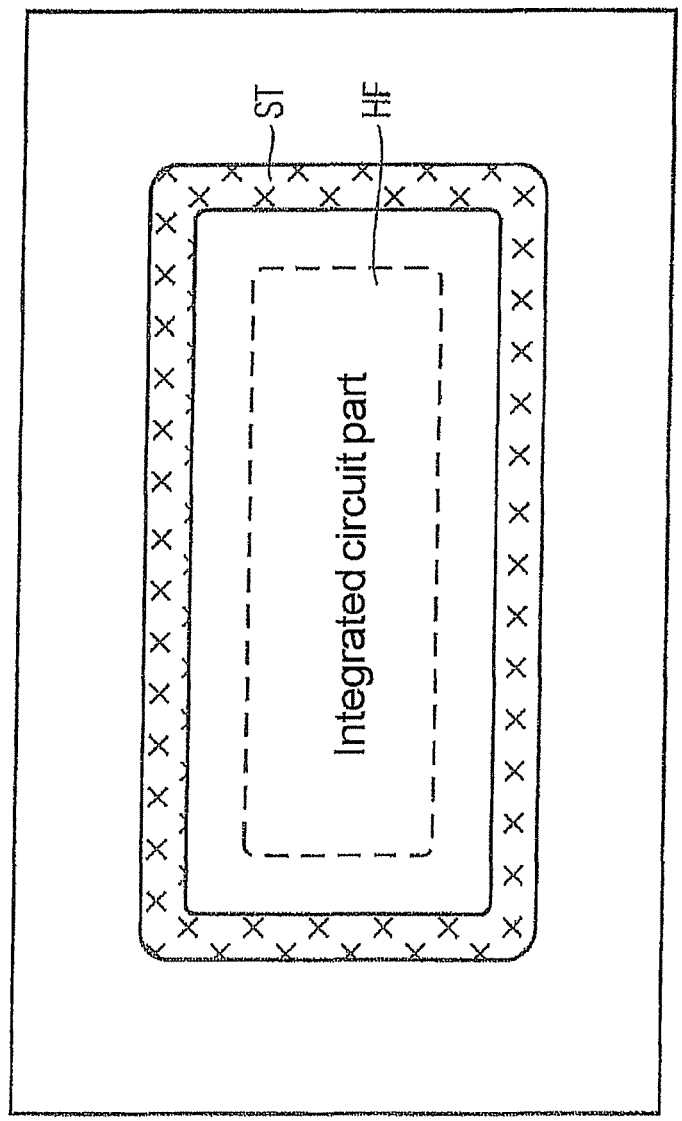
FIG. 2 illustrates a simplified plan view of the integrated circuit in accordance with FIG. 1.

FIG. 2 illustrates a simplified plan view of the integrated circuit IC with integrated shielding device in accordance with FIG. 1, the sinker contact trench ST formed in the carrier substrate constituting a closed ring around the integrated circuit part HF to be shielded. The entry or emergence of electromagnetic radiation laterally below the integrated circuit part can be prevented particularly reliably in this way.

In principle, however, the lower lateral element may also be realized by a plurality of sinker contact trenches or trench structures (not illustrated) which are spaced apart from one another, in which case, however, a distance between the sinker contact trenches is less than $\lambda/10$ and $\lambda$ represents the wavelength of the electromagnetic radiation to be shielded. A higher attenuation is produced in the case of even smaller distances or a narrower grid.

The upper lateral element SE1, which is situated in the wiring levels of the integrated circuit IC, may include for example a multiplicity of contact structures V and also corresponding segments of respective metallization levels MI to Mx which are essentially arranged above the lower lateral element SE2 or the at least one sinker contact trench ST and are electrically connected thereto. The contact structures V may constitute for example pin-type contact vias or strip-type contact via bars.

If, in accordance with FIG. 1, the integrated circuit part HF requires for example the two lower wiring or metallization levels MI and M2 for internal wiring, then the shielding cover element DE is realized at the earliest in the wiring level Mx=M3, there being connected above the sinker contact trench ST contact structures V to a non-wired partial section of the metallization level MI and from the latter a further contact structure V to a non-wired partial section of the metallization level M2 and so on via further contact structures through to a metallization level Mx of the cover element DE.

In this way, for the first time without the use of additional housing elements or the very cost-intensive multichip module technology, an integrated shielding device can be realized as a completely or partly closed cage which can be produced entirely within an integrated circuit IC. In particular, in this case semiconductor materials are used as shielding elements for the first time.

When using a carrier substrate with a highly doped semiconductor substrate 1 and an associated deep substrate contact-connection, an integrated shielding device can thus be provided in a particularly simple and cost-effective manner.

Optionally, the carrier substrate 1, 2, 3 may furthermore have a rear side metallization RM, whereby a shielding effect of, in particular, the base element BE including semiconductor material can be improved further.

Figure 3:
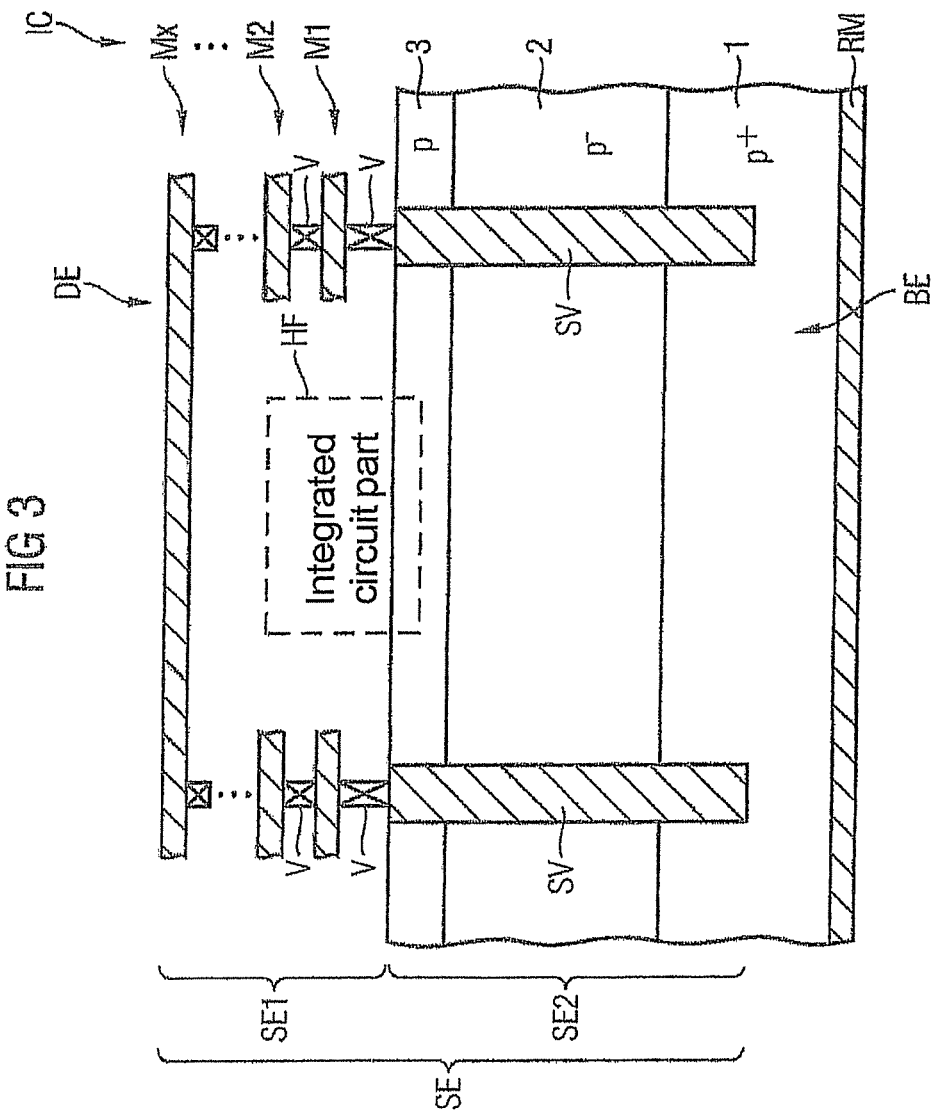
FIG. 3 illustrates a simplified sectional view of an integrated circuit with integrated shielding device for a circuit part to be shielded in accordance with a second exemplary embodiment.

FIG. 3 illustrates a simplified sectional view of an integrated circuit IC with an integrated shielding device for shielding an integrated circuit part HF in accordance with a second exemplary embodiment, identical reference symbols designating elements and layers identical or corresponding to those in FIG. 1, for which reason a repeated description is dispensed with below.

In contrast to the exemplary embodiment in accordance with FIGS. 1 and 2, in the present second exemplary embodiment essentially the lower shielding lateral element SE2 is replaced by an alternative contact structure. To put it more precisely, in accordance with FIG. 3, a multiplicity of sinker contact structures or sinkers SV for making electrical contact with the highly doped semiconductor substrate 1 are used instead of the at least one sinker contact trench or trench structure as the lower lateral element SE2. The sinker contact structures SV may once again constitute for example pin-type sinker contact vias or strip-type sinker contact via bars. A method for producing sinker contact vias SV of this type is known from EP 1 553 625 A1, for example, for which reason a description hereinafter is dispensed with.

By using sinker contact structures SV of this type, which are usually filled with a metallic multilayer construction, it is therefore possible to carry out not only a reliable contact-connection of the shielding base element BE but also a reliable shielding from electromagnetic radiation laterally below the integrated circuit part HF.

Figure 4:
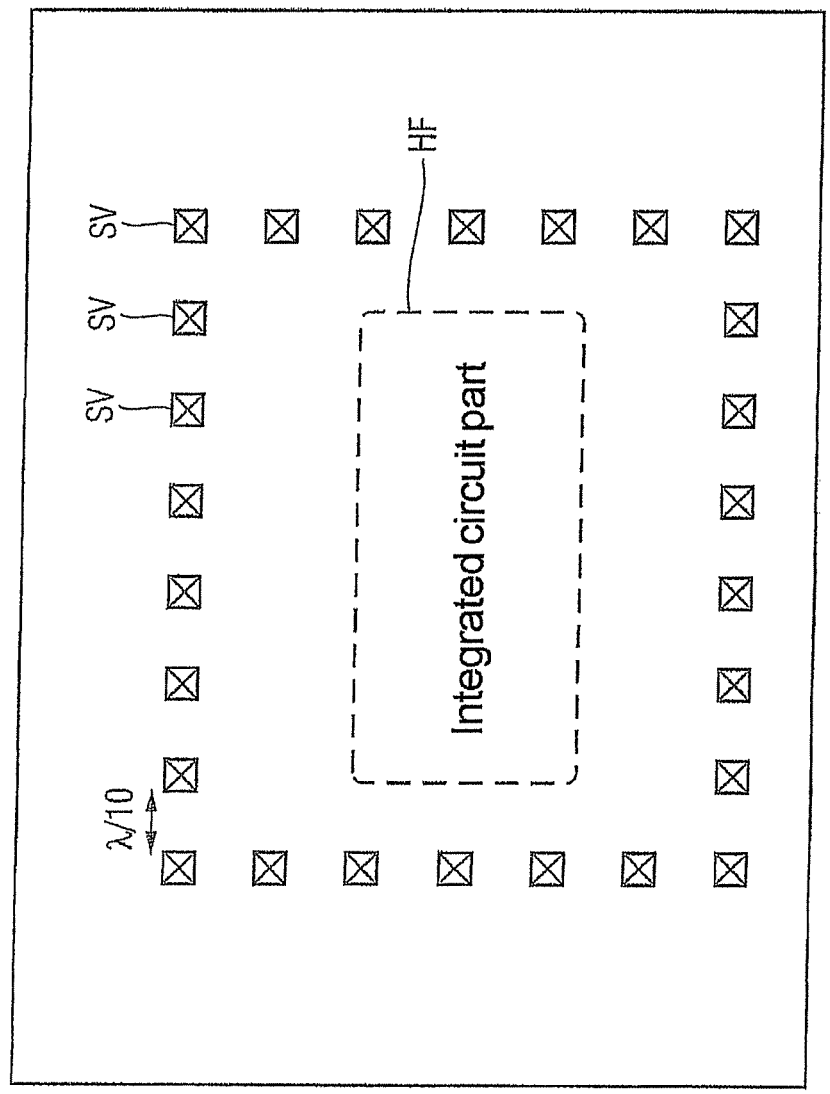
FIG. 4 illustrates a simplified plan view of an integrated circuit in accordance with FIG. 3.

FIG. 4 illustrates a simplified plan view of the integrated circuit IC with integrated shielding device in accordance with this second exemplary embodiment, wherein a multiplicity of spaced-apart sinker contact structures SV of this type are arranged in rectangular fashion around the circuit part HF to be shielded in the carrier substrate 1, 2, 3 and therefore enable a lateral shielding and also an electrical contact-connection of the base element BE to the cover element DE. It goes without saying that a polygonal, circular or other structure is also conceivable for the lateral element.

In order to realize a sufficient shielding effect, the sinker contact structures have a distance of less than $\lambda/10$, where $\lambda$ is the wavelength of the electromagnetic radiation to be shielded. The dimensions of the sinker contact vias SV, i.e. a width of the sinker contact vias SV, are equal to the distance between said sinker contact vias and therefore in turn $\lambda/10$. In contrast to the first exemplary embodiment, this results in a grid-type structure in the lower region of the shielding lateral element SE.

An upper region (not illustrated) of the shielding lateral element SE has essentially a construction identical to that of the lower part, i.e. the construction of the sinker contact structures SV, in which case once again at the surface of the carrier substrate or the well 3 in the wiring planes above the sinker contact structures SV, corresponding contact structures V are formed which realize a respective upper lateral element SE1 via respective non-wired partial sections of the respective metallization levels MI, M2, ... through to a metallization level Mx for a shielding cover element DE.

The contact structures V for the upper lateral element SE1 may also in turn be spaced apart from one another by $\lambda/10$ and have a ring-shaped structure around the integrated circuit part HF to be shielded. In this way, a high-quality lateral shielding is reliably realized in an upper part of the lateral element SE as well.

In accordance with FIG. 3, once again a rear side metallization RM may optionally be formed at the rear side of the carrier substrate 1, 2, 3, whereby a shielding effect toward the bottom can be improved further. Furthermore, the sinker contact structures SV may in this case be formed down to the rear side metallization RM, in which case they completely penetrate through the semiconductor substrate 1.

Figure 5:
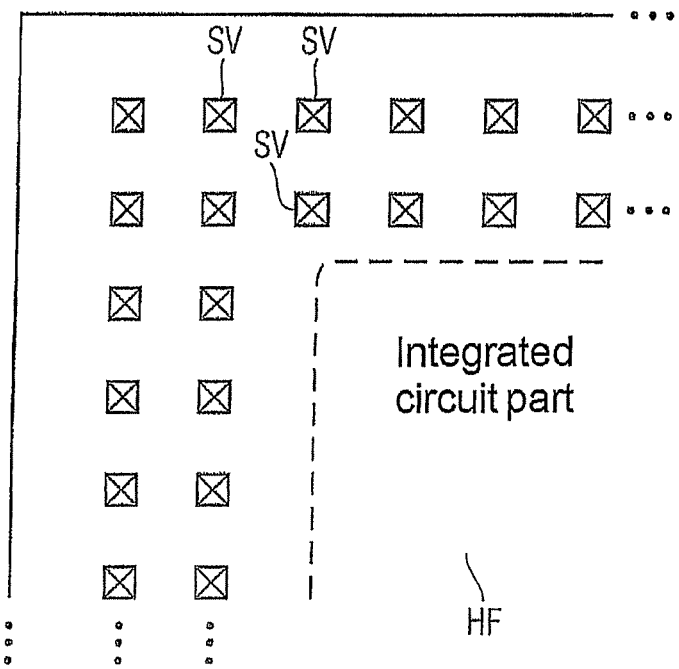
FIG. 5 illustrates a simplified partial plan view of an integrated circuit with shielding device in accordance with a third exemplary embodiment.

FIG. 5 illustrates a partial plan view of an integrated circuit IC with integrated shielding device for an integrated circuit part HF in accordance with a third exemplary embodiment, identical reference symbols once again designating elements identical to those in FIGS. 3 and 4, for which reason a repeated description is dispensed with below.

In contrast to the realization of the shielding lateral elements SE in accordance with FIG. 4, in which sinker contact vias SV are arranged in one line around the integrated circuit part HF, in accordance with FIG. 5 the sinker contact vias SV can also be arranged in two lines or in a plurality of lines (not illustrated) around the integrated circuit part HF.

The sinker contact structures SV are once again spaced apart by less than $\lambda/10$, where $\lambda$ represents the wavelength of the electromagnetic radiation to be shielded. In this way, the sinker contact via SV may also in each case have a width of greater than $\lambda/10$.

The plan view illustrated in FIG. 5 also applies in a corresponding manner to the upper shielding lateral element SE1, in which case the contact structures V arranged in the wiring level may be arranged correspondingly between the respective metallization levels. This results in a further improved shielding effect of the integrated shielding device for the integrated circuit part HF. The resulting shielding cage has a multiple grid structure in this case.

Figure 6:
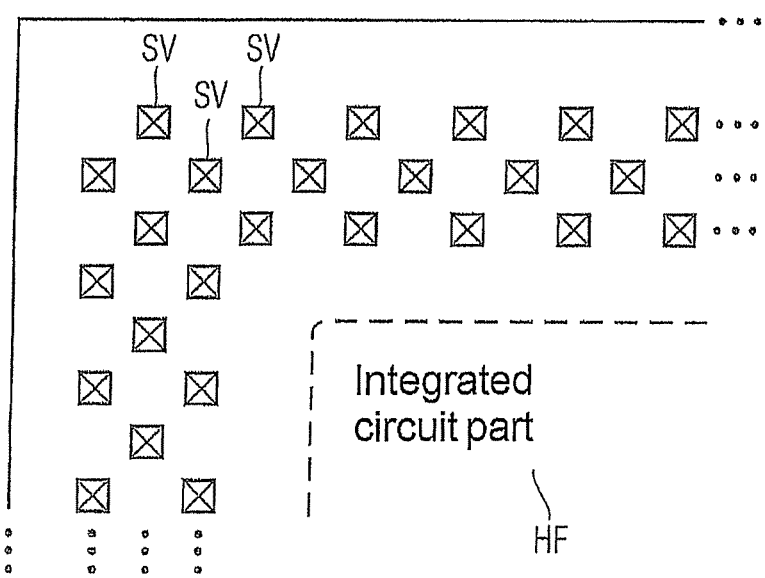
FIG. 6 illustrates a simplified partial plan view of an integrated circuit with shielding device in accordance with a fourth exemplary embodiment.

FIG. 6 illustrates a simplified partial plan view of an integrated circuit IC with an integrated shielding device for an integrated circuit part HF in accordance with a fourth exemplary embodiment, identical reference symbols designating elements identical or corresponding to those in FIGS. 3 to 5, for which reason a repeated description is dispensed with below.

In accordance with FIG. 6, when using a multiple-line arrangement of the sinker contact structures SV and the contact structures V arranged thereabove, it is furthermore possible to carry out an offsetting or offset multiple-line arrangement of the sinker contact structures SV with respect to one another. Although it is once again possible to select a spacing-apart of $\leq \lambda/10$ between the respective sinker contact structures SV, and the contact structures V arranged thereabove, in the case of the offset line arrangement illustrated in FIG. 6 a larger distance through to $\lambda/5$ is also possible without adversely influencing a shielding effect. Particularly in the case of the three-line arrangement of the contact structures V and also sinker contact structures SV as illustrated in FIG. 6, a particularly high-quality lateral shielding is obtained for the integrated circuit part HF.

Figure 7:
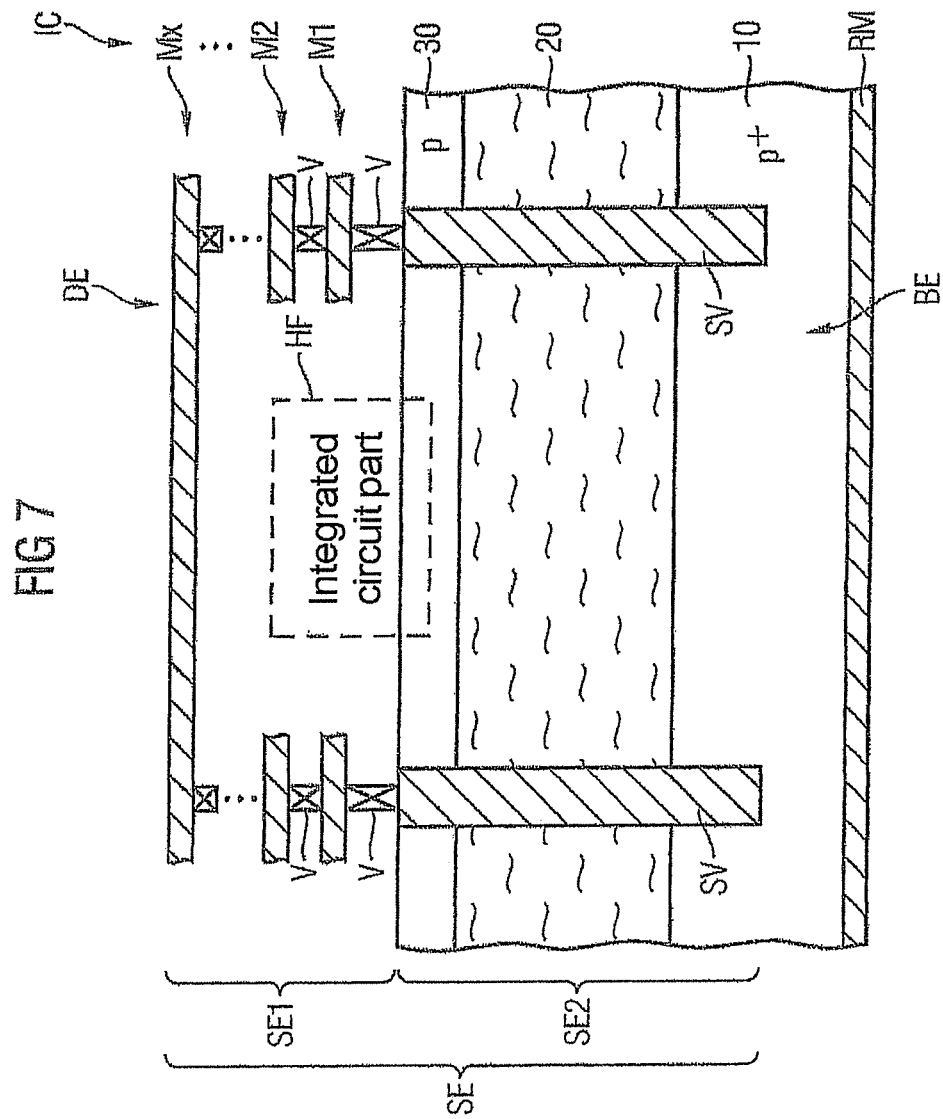
FIG. 7 illustrates a simplified sectional view of an integrated circuit with integrated shielding device in accordance with a fifth exemplary embodiment.

FIG. 7 illustrates a simplified sectional view of an integrated circuit IC with an integrated shielding device for an integrated circuit part HF in accordance with a fifth exemplary embodiment, identical reference symbols designating elements or layers identical or corresponding to those in FIGS. 1 to 6, for which reason a repeated description is dispensed with below.

In accordance with this fifth exemplary embodiment, as an alternative to a conventional carrier substrate in accordance with FIGS. 1 and 3, it is also possible to use a SOI substrate, wherein there is formed on a semiconductor substrate 10 an insulating layer 20 and thereon a semiconductor layer 30 for the actual integrated circuit IC or the integrated circuit part HF. SOI carrier substrates of this type enable particularly high-quality semiconductor circuits since e.g. fully depleted field effect transistor circuits can be realized on account of the semiconductor layer 30 having a thickness that can be set very exactly. Furthermore, strained semiconductor material (strained silicon) may also be applied as the semiconductor layer 30, said material enabling greatly improved radio frequency properties of integrated circuits.

In accordance with FIG. 7, the SOI substrate 10, 20, 30 once again has a heavily doped $p^+$-type semiconductor substrate composed of silicon, which has a resistivity value of less than 15 mohm-cm. This results in the sufficiently high conductivity for the shielding effect of the semiconductor substrate 10 as shielding base element BE. The regions acting as the base element BE may once again also be formed in strip-type or grid-type fashion in the semiconductor substrate. The insulating layer 20 usually includes $SiO_2$ and the thin semiconductor layer 30 may have for example a p-type silicon semiconductor material having a resistivity value of approximately 50 mohm-cm. It goes without saying that it is also possible to use alternative SOI substrates and dopant concentrations provided that they enable a sufficient conductivity for the shielding base region BE.

In accordance with FIG. 7, the lower shielding lateral elements 2 may once again be realized by sinker contact structures SV in accordance with FIGS. 3 to 6, whereby a suitable shielding effect is obtained. Once again a rear side metallization RM may optionally be formed at the rear side of the semiconductor substrate 10, in which case the sinker contact structures SV may once again also reach as far as the rear side metallization RM.

As an alternative, the sinker contact structures SV may also be replaced by the closed sinker contact trenches ST illustrated in FIGS. 1 and 2, whereby it is likewise possible to realize an integrated shielding device having a sufficient shielding effect in an SOI substrate. The upper lateral elements SE1 and the shielding cover element DE are realized in the same way as in the exemplary embodiments in accordance with FIGS. 1 to 6.

It goes without saying that, instead of the p-type doping described, it is also possible to use a correspondingly n-doped semiconductor material or a corresponding combination of p- and n-doped layers as carrier substrate.

As an alternative to the rear side metallization RM, it is also possible to use a metal housing on which the carrier substrate is fixed e.g., by using conductive adhesive.

The invention has been described above on the basis of an integrated circuit IC formed in a monocrystalline p-type semiconductor substrate. It goes without saying that it is also possible to use highly doped n-type semiconductor substrates and, if appropriate, polycrystalline or amorphous semiconductor materials for realizing a partial region of an integrated shielding device.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
 a shielding base element comprising a semiconductor substrate having a first dopant concentration;
 a semiconductor layer formed on a surface of the semiconductor substrate, the semiconductor layer having a second dopant concentration less than the first dopant concentration;
 a doping well formed in the semiconductor layer, the doping well having a third dopant concentration greater than the second dopant concentration;
 a shielding cover element formed in a strip-type arrangement, the strip-type arrangement comprising a plurality of spaced apart parallel strips, each strip extending from a first outer edge of the shielding cover element to a second outer edge of the shielding cover element;
 a circuit in the doping well;
 a shielding lateral element electrically coupling the base and cover elements and extending through the doping well and the semiconductor layer such that the circuit is contained within the shielding elements; and
 a rear side metallization contacting a surface of the shielding base element, the surface facing away from the circuit,
 wherein the shielding lateral element comprises at least one sinker contact formed in the semiconductor substrate, the semiconductor layer, and the doping well.

2. The integrated circuit of claim 1, wherein the semiconductor substrate has a resistivity value of less than 15 mohm-cm.

3. The integrated circuit of claim 1, wherein the shielding cover element and the shielding lateral element form a Faraday cage, and
 wherein the sinker contact and the shielding base element provide a lower portion of the Faraday cage and wherein the shielding cover element provides an upper portion of the Faraday cage.

4. A shielding device for shielding from electromagnetic radiation, comprising:
 a shielding base element comprising a semiconductor substrate having a first dopant concentration;
 a semiconductor layer formed on a surface of the semiconductor substrate, the semiconductor layer having a second dopant concentration less than the first dopant concentration;
 a doping well formed in the semiconductor layer, the doping well having a third dopant concentration greater than the second dopant concentration;
 a shielding cover element formed in a strip-type arrangement, the strip-type arrangement comprising a plurality of spaced apart parallel strips, each strip extending from a first outer edge of the shielding cover element to a second outer edge of the shielding cover element; and
 a shielding lateral element for electrically connecting the base element to the cover element and extending through the doping well and the semiconductor layer in such a way that a circuit part to be shielded is arranged within the shielding elements, wherein at least one partial section of the shielding elements comprises a semiconductor material,
 wherein the shielding lateral element comprises at least one sinker contact formed in the semiconductor substrate, the semiconductor layer, and the doping well.

5. The shielding device of claim 4, wherein the circuit part to be shielded is formed in the doping well and the shielding base element comprises semiconductor material.

6. The shielding device of claim 4, wherein the semiconductor material for the shielding element has a resistivity value of less than 15 mohm-cm.

7. The shielding device of claim 4, wherein the shielding cover element is formed in a wiring level of the integrated circuit.

8. The shielding device of claim 4, wherein the shielding lateral element has an upper lateral element and a lower lateral element.

9. The shielding device of claim 8, wherein the upper lateral element has a multiplicity of contact structures formed between wiring levels.

10. The shielding device of claim 8, wherein the lower lateral element has at least one sinker contact trench formed in the semiconductor substrate, the semiconductor layer, and the doping well.

11. The shielding device of claim 10, wherein the at least one sinker contact trench is filled with metallic material or highly doped semiconductor material.

12. The shielding device of claim 10, wherein the sinker contact trench is formed in closed fashion around the circuit part to be shielded.

13. The shielding device of claim 8, wherein the lower lateral element has a multiplicity of sinker contact structures formed in the semiconductor substrate, the semiconductor layer, and the doping well.

14. The shielding device of claim 13, wherein the sinker contact structures are arranged in one line around the integrated circuit part.

15. The shielding device of claim 13, wherein the sinker contact structures are arranged in a plurality of lines around the integrated circuit part.

16. The shielding device of claim 15, wherein the plurality of lines of sinker contact structures are arranged offset with respect to one another.

17. The shielding device of claim 4, wherein the semiconductor substrate has a resistivity value of less than 15 mohm-cm,
   wherein the semiconductor layer has a resistivity value of about 10 ohm-cm, and
   wherein the doping well has a resistivity value of about 50 mohm-cm.

18. The shielding device of claim 5, wherein the semiconductor layer is an epitaxial semiconductor layer.

19. The shielding device of claim 5, wherein the semiconductor substrate has a rear side metallization at least in the region of the shielding base element.

20. A shielding device for shielding from electromagnetic radiation, comprising:
   a shielding base element comprising a semiconductor substrate having a first dopant concentration;
   a semiconductor layer formed on a surface of the semiconductor substrate, the semiconductor layer having a second dopant concentration less than the first dopant concentration;
   a doping well formed in the semiconductor layer, the doping well having a third dopant concentration greater than the second dopant concentration;
   a shielding cover element formed in a strip-type arrangement, the strip-type arrangement comprising a plurality of spaced apart parallel strips, each strip extending from a first outer edge of the shielding cover element to a second outer edge of the shielding cover element; and
   a shielding lateral element for electrically connecting the base element to the cover element and extending through the doping well and the semiconductor layer in such a way to form a Faraday cage, wherein a circuit part to be shielded is arranged within the Faraday cage, wherein at least one partial section of the shielding elements comprises a semiconductor material,
wherein the circuit part to be shielded is formed in the doping well and the shielding base element comprises semiconductor material,
wherein the shielding lateral element comprises a multiplicity of sinker contacts formed in the semiconductor substrate, the semiconductor layer, and the doping well,
wherein the sinker contacts and the shielding base element provide a lower portion of the Faraday cage and wherein the shielding cover element provides an upper portion of the Faraday cage,
wherein the sinker contacts are arranged in a plurality of lines around the circuit part, and
wherein the plurality of lines of the sinker contacts are arranged offset with respect to one another such that each sinker contact in a first one of the plurality of lines is not aligned with a sinker contact in a directly adjacent second one of the plurality of lines in a direction perpendicular to the first one and the second one of the plurality of lines.

* * * * *